(12) United States Patent
Wakino et al.

(10) Patent No.: US 10,517,191 B2
(45) Date of Patent: Dec. 24, 2019

(54) LIQUID IMMERSION SERVER

(71) Applicant: FUJITSU LIMITED, Kawasaki-shi, Kanagawa (JP)

(72) Inventors: Yukiko Wakino, Sagamihara (JP); Satoshi Inano, Minoh (JP); Hiroyuki Fukuda, Yokohama (JP); Minoru Ishinabe, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/131,105

(22) Filed: Sep. 14, 2018

(65) Prior Publication Data

US 2019/0098796 A1  Mar. 28, 2019

(30) Foreign Application Priority Data

Sep. 26, 2017 (JP) .................................. 2017-184916

(51) Int. Cl.
*H05K 7/20* (2006.01)
*G06F 1/20* (2006.01)

(52) U.S. Cl.
CPC .......... *H05K 7/20236* (2013.01); *G06F 1/20* (2013.01); *G06F 1/206* (2013.01); *H05K 7/20272* (2013.01); *H05K 7/20772* (2013.01); *G06F 2200/201* (2013.01)

(58) Field of Classification Search
CPC ................................................ H05K 7/20236
See application file for complete search history.

(56) References Cited

U.S. PATENT DOCUMENTS

| 3,406,244 | A | * | 10/1968 | Oktay | F28C 3/04 165/104.13 |
|---|---|---|---|---|---|
| 7,307,841 | B2 | * | 12/2007 | Berlin | H01L 23/44 165/80.4 |
| 8,490,679 | B2 | * | 7/2013 | Campbell | F28D 15/02 165/80.2 |
| 2009/0260777 | A1 | | 10/2009 | Attlesey | |
| 2013/0139998 | A1 | * | 6/2013 | Hayashi | H01L 23/473 165/47 |
| 2018/0020571 | A1 | * | 1/2018 | Saito | G06F 1/20 |

FOREIGN PATENT DOCUMENTS

| JP | 4-170097 | 6/1992 |
|---|---|---|
| JP | 2011-518395 | 6/2011 |
| WO | 2012/025981 | 3/2012 |

* cited by examiner

*Primary Examiner* — Mukundbhai G Patel
(74) *Attorney, Agent, or Firm* — Fujitsu Patent Center

(57) ABSTRACT

A liquid immersion server includes a processor, a heat sink to which heat generated by the processor is transferred, a flow channel through which a first refrigerant liquid that has absorbed heat from the heat sink flows, and a cooling bath that stores a second refrigerant liquid that is inactive in a lower section thereof and that stores the first refrigerant liquid in an upper section thereof, wherein when the liquid immersion server is in operation, the processor, the heat sink, and the flow channel are immersed in the second refrigerant liquid, the flow channel has a supply port to which the first refrigerant liquid is supplied from a first pipe and a first discharge port that discharges the first refrigerant liquid that has absorbed heat into the cooling bath.

5 Claims, 13 Drawing Sheets

FIG. 9

| | TEMPERATURE (°C) AT WHICH COOLING WATER WAS SUPPLIED | INITIAL TEMPERATURE (°C) OF INACTIVE REFRIGERANT | CPU TEMPERATURE (°C) | HIGHEST TEMPERATURE (°C) IN COOLING BATH | TEMPERATURE (°C) AT WHICH COOLING WATER WAS DISCHARGED |
|---|---|---|---|---|---|
| FIRST EMBODIMENT (FIG. 8A) | 15 | 20 | 30 TO 33 | 53 | 20 |
| FIRST EMBODIMENT (FIG. 8A) | 20 | 20 | 35 TO 38 | 57 | 25 |
| FIRST EMBODIMENT (FIG. 8A) | 25 | 20 | 40 TO 43 | 62 | 30 |
| COMPARATIVE EXAMPLE (FIG. 8B) | 15 | 20 | 30 TO 59 | 59 | 19 |

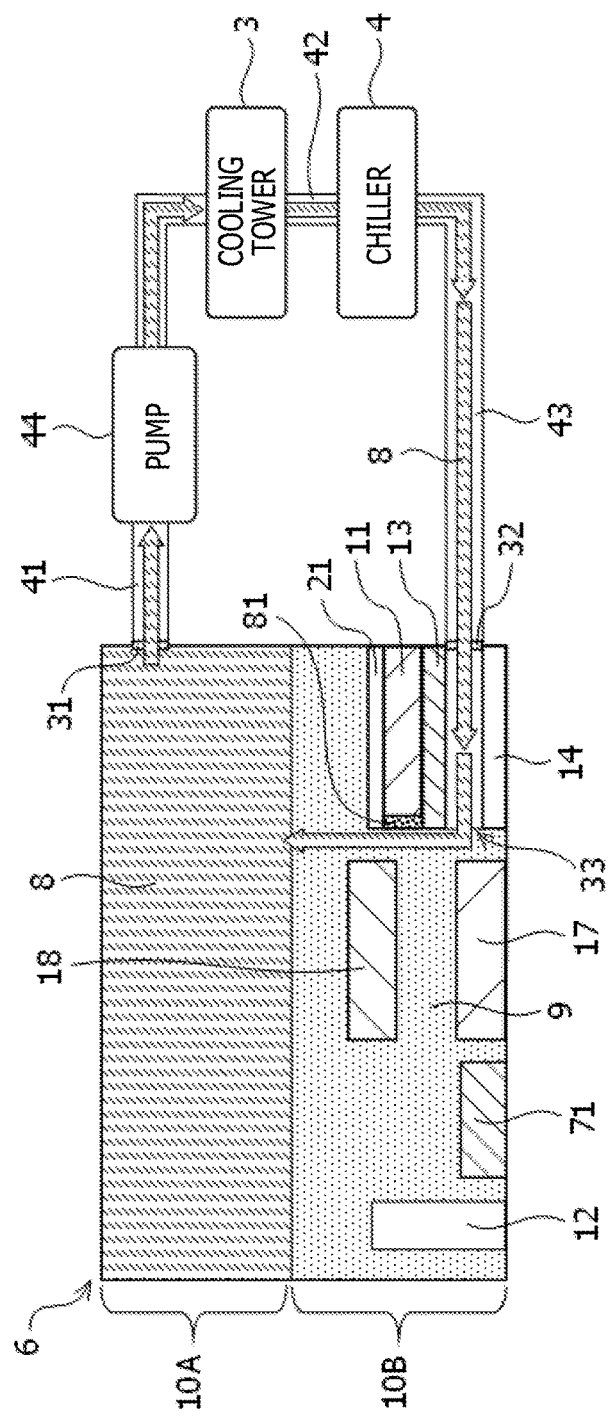

LIQUID IMMERSION SERVER

CROSS-REFERENCE TO RELATED APPLICATION

This application is based upon and claims the benefit of priority of the prior Japanese Patent Application No. 2017-184916, filed on Sep. 26, 2017, the entire contents of which are incorporated herein by reference.

FIELD

The embodiments discussed herein are related to a liquid immersion server.

BACKGROUND

Cooling systems have been changing from air cooling to liquid cooling in view of higher parts packing densities and efforts to save space and energy in data centers. As liquid immersion cooling systems are introduced for liquid cooling, inactive refrigerants are finding use therein. It has been customary to immerse electronic parts entirely in an inactive refrigerant having a high boiling point in an open cooling bath for thereby cooling the electronic parts.

Inactive refrigerants are low in thermal conductivity than water and are highly costly. It has been desirous of reducing the amount of an inactive refrigerant used for liquid immersion cooling. According to an aspect of the present embodiment, it is an object of the present embodiment to reduce the amount of an inactive refrigerant used.

The followings are reference documents.
[Document 1] International Publication Pamphlet No. WO 2012/025981,
[Document 2] Japanese Laid-open Patent Publication No. 4-170097, and
[Document 3] Japanese National Publication of International Patent Application No. 2011-518395.

SUMMARY

According to an aspect of the invention, a liquid immersion server includes a processor, a heat sink to which heat generated by the processor is transferred, a flow channel through which a first refrigerant liquid that has absorbed heat from the heat sink flows, and a cooling bath that stores a second refrigerant liquid that is inactive in a lower section thereof and that stores the first refrigerant liquid in an upper section thereof, wherein when the liquid immersion server is in operation, the processor, the heat sink, and the flow channel are immersed in the second refrigerant liquid, the flow channel has a supply port to which the first refrigerant liquid is supplied from a first pipe and a first discharge port that discharges the first refrigerant liquid that has absorbed heat into the cooling bath, the cooling bath has a second discharge port that discharges the first refrigerant liquid that has absorbed heat into a second pipe, and the density of the first refrigerant liquid is smaller than the density of the second refrigerant liquid.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 9 is a table of conditions and results of simulation analyses conducted on the cooling baths illustrated in FIGS. 8A and 8B;

FIG. 13 is a structural view of the cooling bath as viewed from a side surface of the liquid immersion cooling apparatus according to the second embodiment.

DESCRIPTION OF EMBODIMENTS

Liquid immersion servers according to respective embodiments will be described below with reference to the drawings. Structural details of the liquid immersion servers illustrated below are by way of example only, and the embodiments are not limited to those illustrated structural details of the liquid immersion servers.

<First Embodiment>

Figure 1:
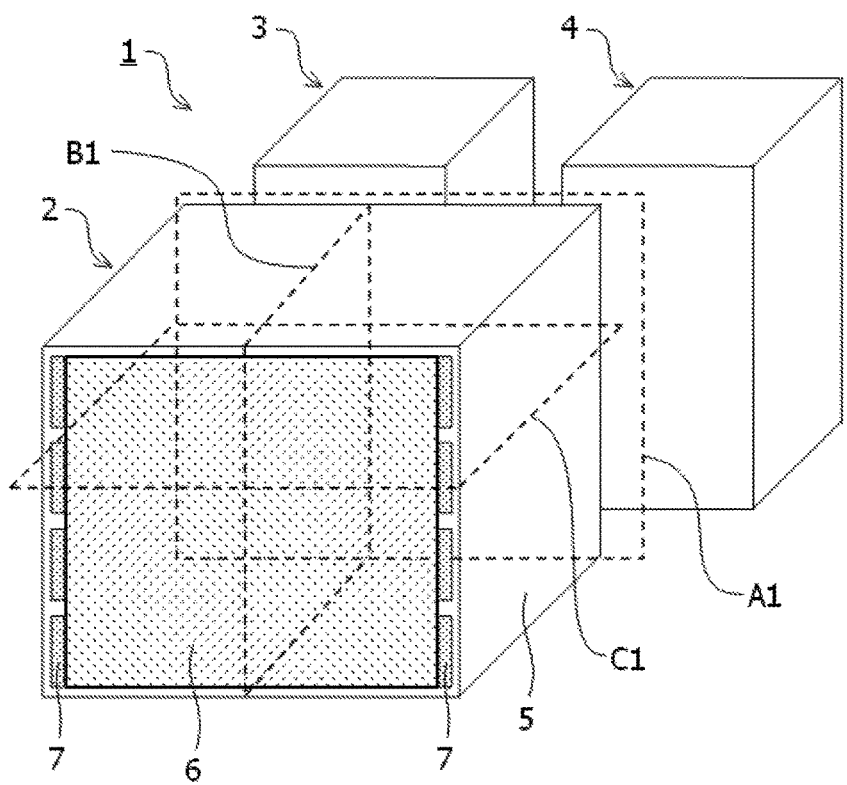
FIG. 1 is a perspective view of a liquid immersion server according to a first embodiment.

A liquid immersion server 1 according to a first embodiment will be described below with reference to FIGS. 1 through 7. FIG. 1 is a perspective view of the liquid immersion server 1 according to the first embodiment. The liquid immersion server 1 is a rack-mounted server. The liquid immersion server 1 includes a liquid immersion cooling apparatus 2, a cooling tower 3, and a chiller 4. The liquid immersion cooling apparatus 2 has a casing or rack 5 and a cooling bath 6 disposed in the casing 5. The liquid immersion cooling apparatus 2 may have a plurality of cooling baths 6 disposed in the casing 5. The liquid immersion server 1 may be of a structure in which a plurality of cooling baths 6 may be stacked in the casing 5 or may be of a structure in which a plurality of cooling baths 6 may be juxtaposed on a same plane in the casing 5.

Rails 7 may be disposed in the casing 5 and the cooling bath 6 may be held by the rails 7. The cooling bath 6 may be movable along the rails 7 so that the cooling bath 6 may be pulled out of the casing 5 for maintenance and/or replacement. The cooling bath 6 stores cooling water in an upper section thereof and also stores an inactive refrigerant such as Fluorinert, or the like in a lower section thereof. The inactive refrigerant is a refrigerant undissolvable in the cooling water. The cooling water is an example of a first refrigerant liquid. The inactive refrigerant is an example of a second refrigerant liquid that is inactive. Electronic parts such as processors, memories, and so on are immersed in the inactive refrigerant. When the liquid immersion server 1 is shipped out of the factory, however, the electronic parts are not immersed in the inactive refrigerant. When the liquid immersion server 1 is in operation, the cooling water and the inactive refrigerant are introduced into and stored in the cooling bath 6, immersing the electronic parts in the inactive refrigerant. The cooling tower 3 and the chiller 4 are coupled to the liquid immersion cooling apparatus 2. The cooling water circulates through the liquid immersion cooling apparatus 2, the cooling tower 3, and the chiller 4.

Figure 2:
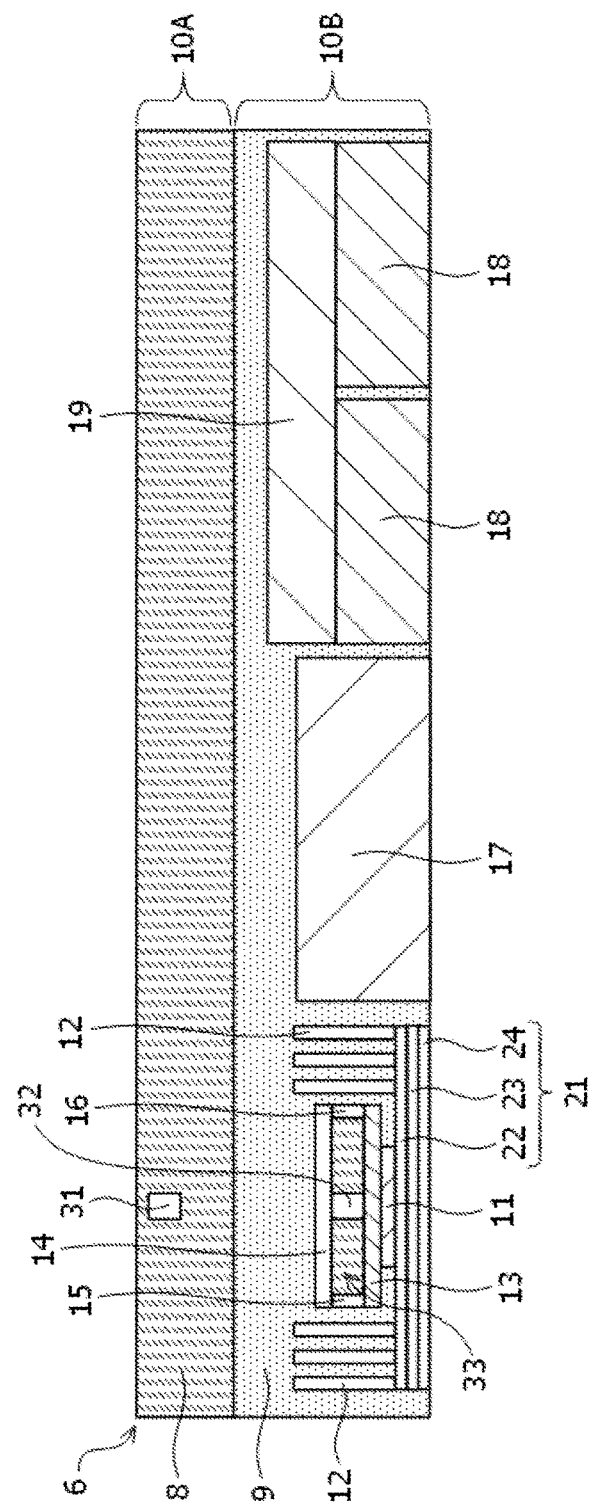
FIG. 2 is a structural view of a cooling bath as viewed from a rear surface of a liquid immersion cooling apparatus according to the first embodiment.
Figure 3:
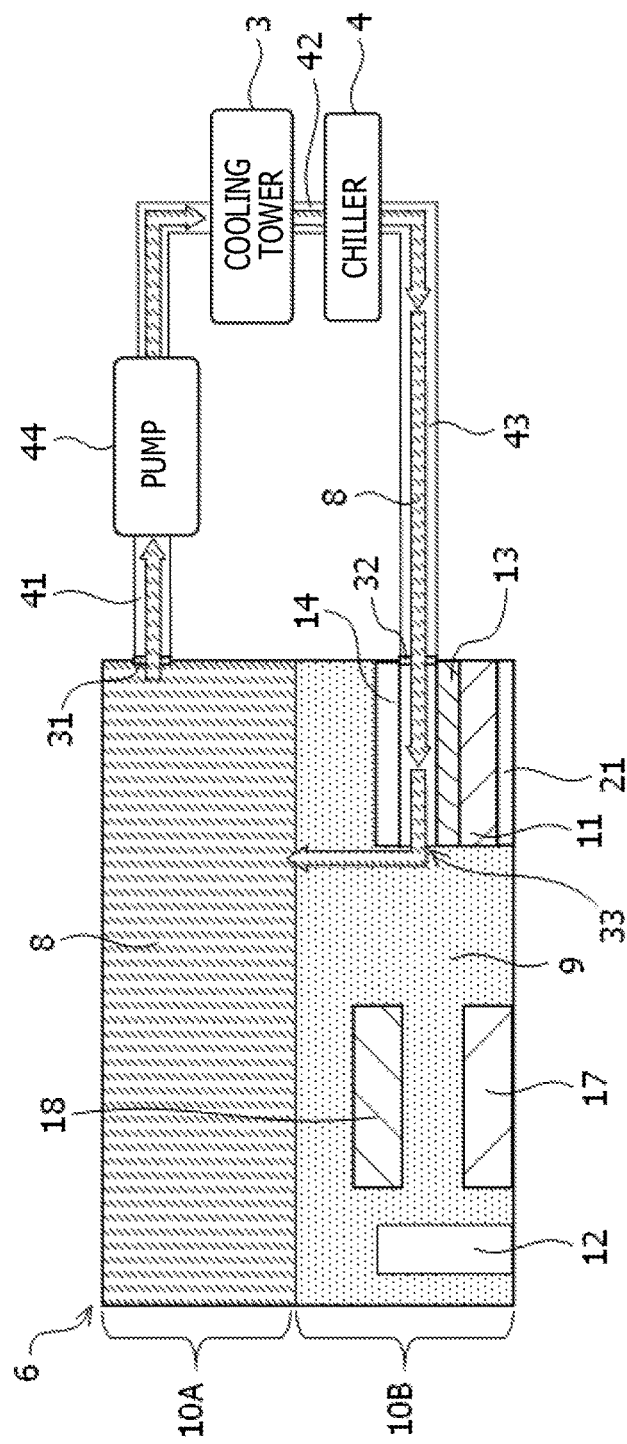
FIG. 3 is a structural view of the cooling bath as viewed from a side surface of the liquid immersion cooling apparatus according to the first embodiment.
Figure 4:
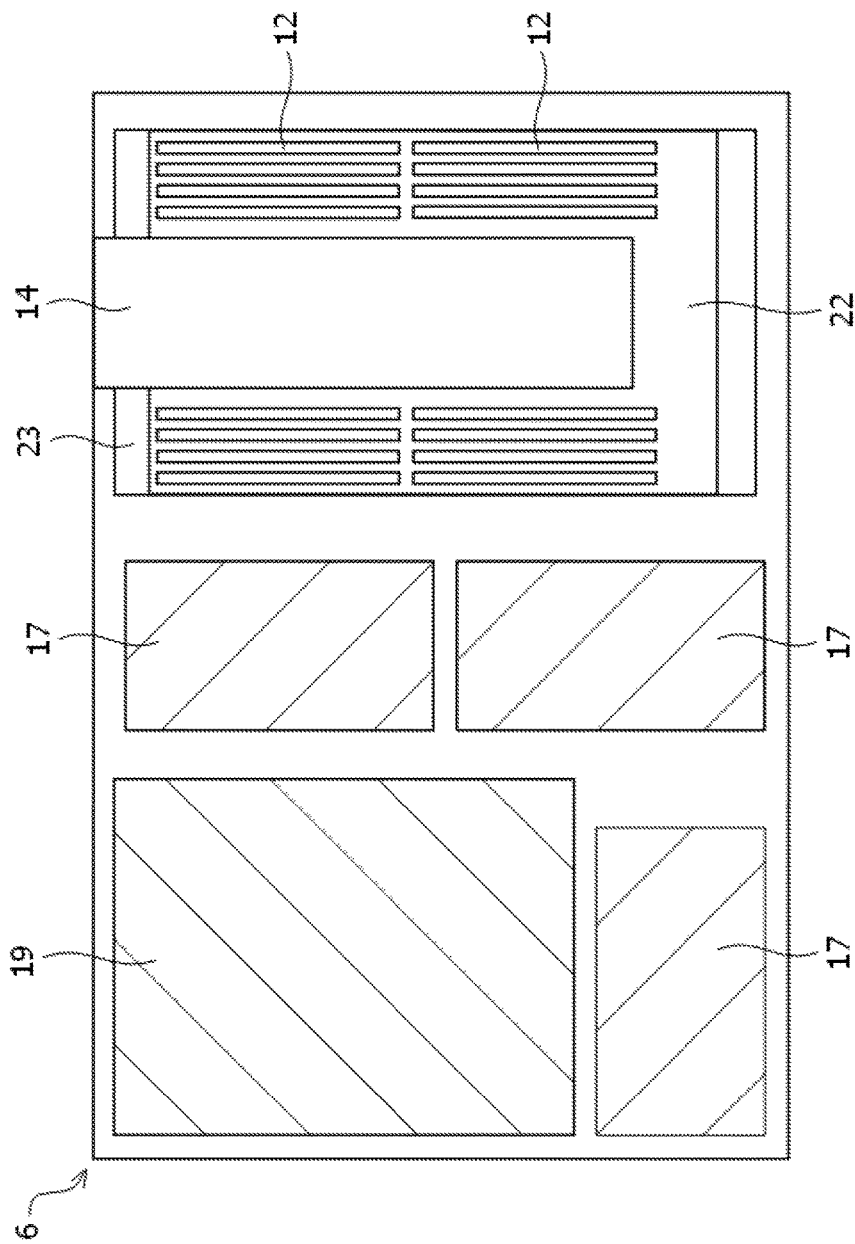
FIG. 4 is a structural view of the cooling bath as viewed from an upper surface of the liquid immersion cooling apparatus according to the first embodiment.

FIG. 2 is a structural view of the cooling bath 6 as viewed from a rear surface of the liquid immersion cooling apparatus 2. FIG. 2 depicts the cooling bath 6 as viewed from a plane A1 in FIG. 1. FIG. 3 is a structural view of the cooling bath 6 as viewed from a side surface of the liquid immersion cooling apparatus 2. FIG. 3 depicts the cooling bath 6 as viewed from a plane B1 in FIG. 1. FIG. 4 is a structural view of the cooling bath 6 as viewed from an upper surface of the liquid immersion cooling apparatus 2. FIG. 4 depicts the cooling bath 6 as viewed from a plane C1 in FIG. 1. The cooling water, denoted by 8, is stored in the upper section of the cooling bath 6, and the inactive refrigerant, denoted by 9, is stored in the lower section of the cooling bath 6. The upper section of the cooling bath 6 serves as a heat exchanger unit 10A, and the lower section of the cooling bath 6 serves as a liquid immersion cooling unit 10B.

When the liquid immersion server 1 is in operation, a central processing unit (CPU) 11, dual inline memory modules (DIMMs) 12, a heat sink 13, flow channel defining plates 14 through 16, a hard disk drive (HDD) 17, power supply units (PSUs) 18, and an interface (IF) card 19 are immersed in the inactive refrigerant 9. The CPU 11 is an example of a processor. The DIMMs 12 are an example of a memory, circuit boards 21 are disposed under the CPU 11. The DIMMs 12 may be mounted on the circuit boards 21 or may be spaced from the circuit boards 21. The circuit boards 21 include a CPU board 22, a system board 23, and a redundant array of inexpensive disks (RAID) card 24. Therefore, when the liquid immersion server 1 is in operation, the CPU board 22, the system board 23, and the RAID card 24 are immersed in the inactive refrigerant 9. The layout of the CPU 11, the DIMMs 12, the heat sink 13, the flow channel defining plates 14 through 16, the HDD 17, the PSUs 18, the IF card 19, and the circuit boards 21 in FIGS. 2 through 4 is by way of illustrative example only.

The heat exchanger unit 10A has a cooling water discharge port 31, and the liquid immersion cooling unit 10B has a cooling water supply port 32. The cooling water 8 in the cooling tank 6 is discharged from the cooling water discharge port 31. The cooling water 8 is supplied from the cooling water supply port 32 to a flow channel 33 that is defined above the heat sink 13 by the flow channel defining plates 14 through 16 that are disposed over the heat sink 13. The cooling water 8 flows through the flow channel 33 that is immersed in the inactive refrigerant 9. The flow channel defining plate 14 serves as a ceiling or upper wall of the flow channel 33. The flow channel defining plates 15 and 16 serve as respective side walls of the flow channel 33. The heat sink 13 may serve as a bottom or lower wall of the flow channel 33. The flow channel defining plates 14 through 16 are made of a metal such as copper (Cu), aluminum (Al), or the like, or a highly thermoconductive resin such as a resin containing an electrically conductive filler or the like.

The cooling bath 6 and the cooling tower 3 are coupled to each other by a pipe 41 which is disposed between the cooling bath 6 and the cooling tower 3. The pipe 41 is coupled to the cooling water discharge port 31 of the cooling bath 6, so that the cooling water 8 will be discharged from the cooling bath 6 through the cooling water discharge port 31 into the pipe 41. The cooling tower 3 and the chiller 4 are coupled to each other by a pipe 42 which is disposed between the cooling tower 3 and the chiller 4. The chiller 4 and the cooling bath 6 are coupled to each other by a pipe 43 which is disposed between the chiller 4 and the cooling bath 6. The pipe 43 is coupled to the cooling water supply port 32 of the cooling bath 6, so that the cooling water 8 will be supplied from the cooling water supply port 32 into the cooling bath 6 through the pipe 43. A pump 44 is coupled to the pipe 41. When the pump 44 is actuated, the cooling water 8 discharged from the cooling bath 6 into the pipe 41 is delivered through the cooling tower 3, the pipe 42, the chiller 4, and the pipe 43 to the cooling bath 6. Consequently, the pump 44 that is actuated circulates the cooling water 8 in the cooling bath 6 through the cooling bath 6, the cooling tower 3, and the chiller 4. While the pump 44 is coupled to the pipe 41 in the structural example illustrated in FIG. 3, the pump 44 is not limited to the position in the structural example illustrated in FIG. 3, but may be coupled to the pipe 42 or the pipe 43.

The flow channel 33 includes a supply port and a discharge port. The support port of the flow channel 33 is coupled to the cooling water supply port 32. The supply port of the flow channel 33 supplies the cooling water 8 from the pipe 43 to the flow channel 33. The pipe 43 is an example of a first pipe. The cooling water 8 that has been supplied to the flow channel 33 flows through the flow channel 33. The CPU 11 is held in contact with the heat sink 13, so that the heat generated by the CPU 11 is transferred to the heat sink 13. The cooling water 8 that flows through the flow channel 33 absorbs heat from the heat sink 13. The discharge port of the flow channel 33 is disposed in the cooling bath 6. The discharge port of the flow channel 33 discharges the cooling water 8 that has absorbed the heat into the cooling bath 6. While the liquid immersion server 1 is in operation, since the flow channel 33 is immersed in the inactive refrigerant 9, the discharge port of the flow channel 33 discharges the cooling water 8 that has absorbed the heat into the inactive refrigerant 9. The discharge port of the flow channel 33 is an example of a first discharge port. The density of the cooling water 8 is smaller than the density of the inactive refrigerant 9. Because of the difference between the density of the cooling water 8 and the density of the inactive refrigerant 9, the cooling water 8 ascends in the inactive refrigerant 9. Since the flow channel 33 is disposed above the CPU 11, the cooling water 8 discharged from the discharge port of the flow channel 33 into the inactive refrigerant 9 does not enter the CPU 11. The density ($g/cm^3$) of water at 25° C. is 0.997, whereas the density ($g/cm^3$) of Fluorinert (FC-3238, manufactured by 3M Company) at 25° C. is 1.83. Fluorinert is an example of the inactive refrigerant 9. The cooling water 8 that has ascended in the inactive refrigerant 9 flows into the cooling water 8 in the heat exchanger unit 10A. The thermal conductivity (W/m·K) of water at 25° C. is 0.608, whereas the thermal conductivity (W/m·K) of Fluorinert (FC-3238, manufactured by 3M Company) at 25° C. is 0.067.

Inasmuch as the flow channel 33 extends along the heat sink 13, the cooling water 8 that has been supplied to the flow channel 33 flows along the heat sink 13. As the cooling water 8 flows along the heat sink 13, the cooling water 8 absorbs heat efficiently from the heat sink 13. Consequently, the CPU 11 and the heat sink 13 has their heat radiation efficiency increased. The cooling water 8 that has been discharged into the inactive refrigerant 9 and the inactive refrigerant 9 exchange heat therebetween. The heat exchange between the cooling water 8 that has been discharged into the inactive refrigerant 9 and the inactive refrigerant 9 lowers the temperature of the inactive refrigerant 9 that exists around the cooling water 8 that has been discharged into the inactive refrigerant 9.

The inactive refrigerant 9 and the electronic parts exchange heat therebetween. The electronic parts include the DIMMs 12, the HDD 17, the PSUs 18, the IF card 19, or the circuit boards 21, or any combination thereof. The electronic parts are cooled by the inactive refrigerant 9, and the inactive refrigerant 9 is warmed by the electronic parts. The inactive refrigerant 9 that has been warmed has its density reduced, and moves to the interface between the heat exchanger unit 10A and the liquid immersion cooling unit 10B. The cooling water 8 and the warmed inactive refrigerant 9 exchange heat therebetween, lowering the temperature of the inactive refrigerant 9. As the temperature of the inactive refrigerant 9 drops, the density of the inactive refrigerant 9 increases, whereupon the inactive refrigerant 9 moves to the bottom of the liquid immersion cooling unit 10B. Since the warmed inactive refrigerant 9 moves to the interface between the heat exchanger unit 10A and the liquid immersion cooling unit 10B, and the cooled inactive refrigerant 9 moves to the bottom of the liquid immersion cooling unit 10B, natural convection occurs in the inactive refrigerant 9.

The heat exchange between the cooling water 8 and the warmed inactive refrigerant 9 gives rise to an increase in the temperature of the cooling water 8 at the interface between the heat exchanger unit 10A and the liquid immersion cooling unit 10B. The warmed cooling water 8 is discharged from the cooling water discharge port 31 into the pipe 41. For example, the cooling water discharge port 31 discharges the cooling water 8 that has absorbed heat into the pipe 41. The cooling water discharge port 31 is an example of a second discharge port. The pipe 41 is an example of a second pipe. The cooling water 8 that has been discharged into the pipe 41 is cooled by flowing through the cooling tower 3 and the chiller 4. The cooling tower 3 may be of the open type or the closed type. If the cooling tower 3 is of the open type, the cooling water 8 is brought into direct contact with the outside air and is cooled as part of the cooling water 8 is evaporated. If the cooling tower 3 is of the closed type, the pipe 41 is placed in the cooling tower 3 and is air-cooled or water-cooled to cool the cooling water 8. The chiller 4 cools the cooling water 8 using a compressor. The cooling water 8 may be cooled by either one of the cooling tower 3 and the chiller 4. The cooling tower 3 and the chiller 4 are an example of a cooling apparatus.

Figure 5:
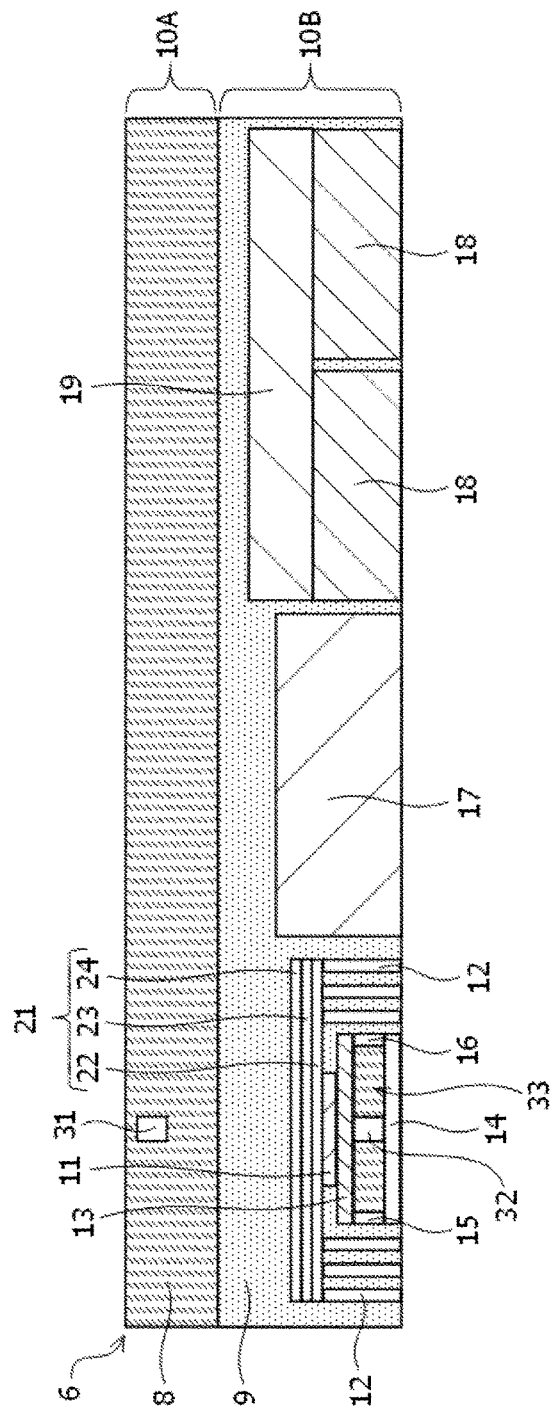
FIG. 5 is a structural view of a cooling bath as viewed from a rear surface of the liquid immersion cooling apparatus according to a modification of the first embodiment.
Figure 6:
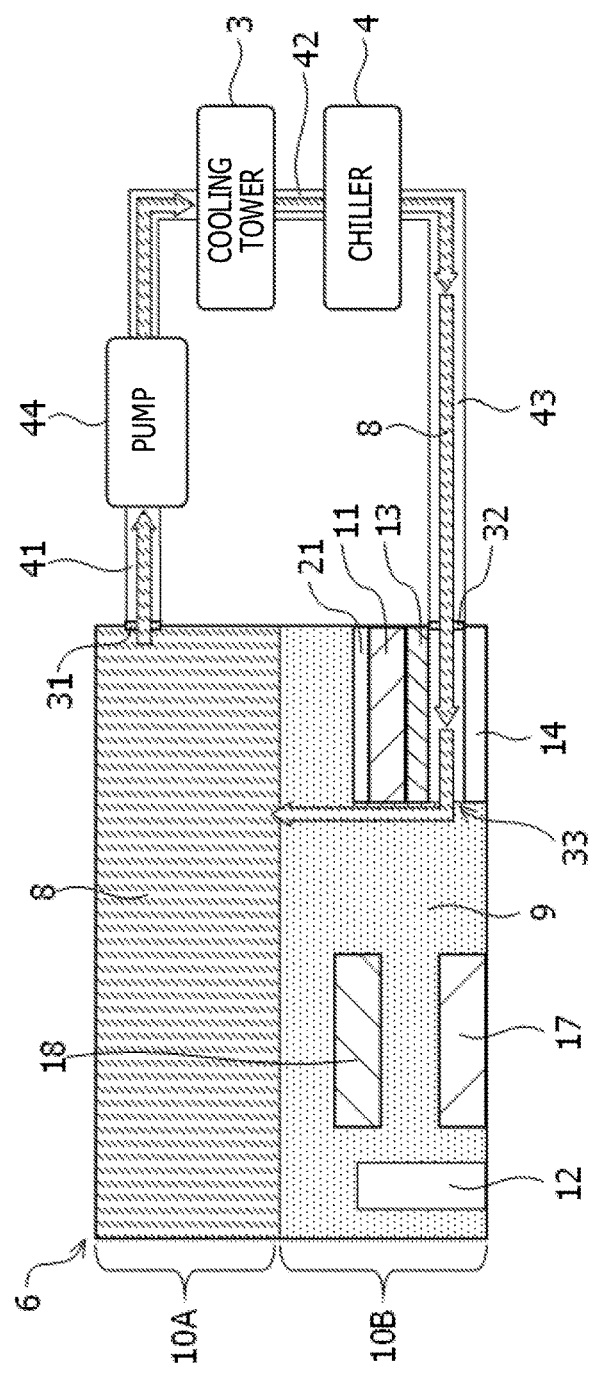
FIG. 6 is a structural view of the cooling bath as viewed from a side surface of the liquid immersion cooling apparatus according to the modification of the first embodiment.

In the structural example depicted in FIGS. 2 through 4, the heat sink 13 and the flow channel 33 are disposed over the CPU 11. However, as depicted in FIGS. 5 and 6, the heat sink 13 and the flow channel 33 may be disposed under the CPU 11. FIG. 5 is a structural view of a cooling bath 6 as viewed from a rear surface of a liquid immersion cooling apparatus 2 according to a modification of the first embodiment. FIG. 5 depicts the cooling bath 6 as viewed from the plane A1 in FIG. 1. FIG. 6 is a structural view of the cooling bath 6 as viewed from a side surface of the liquid immersion cooling apparatus 2 according to the modification of the first embodiment. FIG. 6 depicts the cooling bath 6 as viewed from the plane B1 in FIG. 1. The flow channel defining plates 14 through 16 are disposed under the heat sink 13, and the flow channel 33 is defined under the heat sink 13. While the liquid immersion server 1 is in operation, the flow channel 33 is immersed in the inactive refrigerant 9, and the cooling water 8 flows through the flow channel 33. The flow channel defining plate 14 serves as a bottom or lower wall of the flow channel 33. The flow channel defining plates 15 and 16 serve as respective side walls of the flow channel 33. The heat sink 13 may serve as a ceiling or upper wall of the flow channel 33. The layout of the CPU 11, the DIMMs 12, the heat sink 13, the flow channel defining plates 14 through 16, the HDD 17, the PSUs 18, the IF card 19, and the circuit boards 21 in FIGS. 5 and 6 is by way of illustrative example only.

Figure 7:
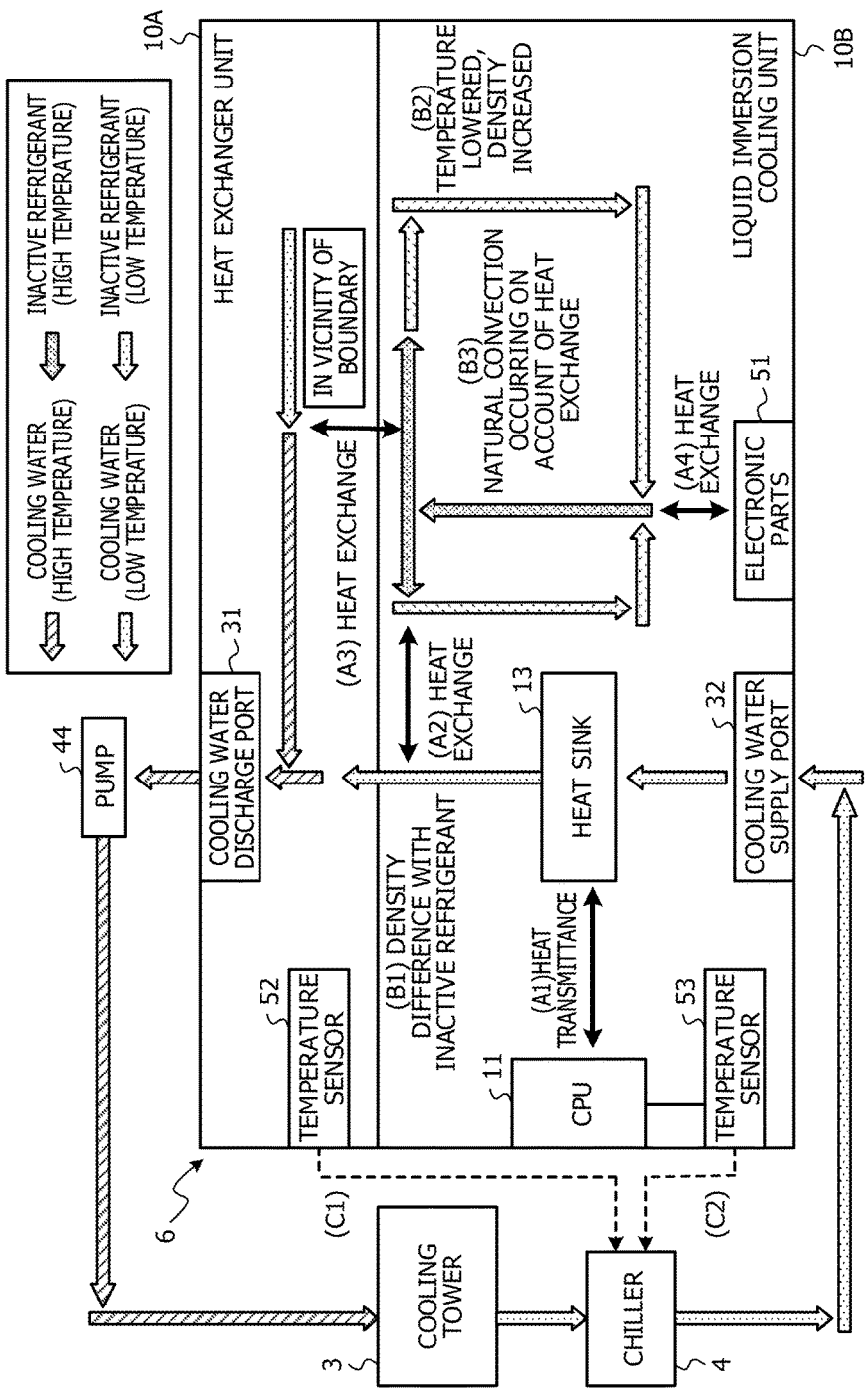
FIG. 7 is a diagram illustrating flows of cooling water and flows of an inactive refrigerant in the liquid immersion server according to the first embodiment.

FIG. 7 is a diagram illustrating flows of the cooling water 8 and flows of the inactive refrigerant 9 in the liquid immersion server 1 according to the first embodiment. The heat generated by the CPU 11 is transferred to the heat sink 13, cooling the CPU 11 (A1). When the cooling water 8 supplied from the cooling water supply port 32 into the liquid immersion cooling unit 10B flows through the flow channel 33, the cooling water 8 absorbs heat from the heat sink 13. The cooling water 8 that has absorbed the heat is discharged from the discharge port of the flow channel 33 into the inactive refrigerant 9. Since the density of the cooling water 8 is smaller than the density of the inactive refrigerant 9, the cooling water 8 ascends toward the heat exchanger unit 10A (B1). The cooling water 8 that ascends toward the heat exchanger unit 10A and the inactive refrigerant 9 exchange heat therebetween (A2). At the boundary between the heat exchanger unit 10A and the liquid immersion cooling unit 10B or in the vicinity of the boundary therebetween, the cooling water 8 and the inactive refrigerant 9 exchange heat therebetween (A3). The heat exchange between the cooling water 8 and the inactive refrigerant 9 lowers the temperature of the inactive refrigerant 9, increasing the density of the inactive refrigerant 9 (B2). At the bottom of the liquid immersion cooling unit 10B, the inactive refrigerant 9 and the electronic parts, denoted by 51, exchange heat therebetween (A4). The electronic parts 51 include the DIMMs 12, the HDD 17, the PSUs 18, the IF card 19, or the circuit boards 21, or any combination thereof. On account of the heat exchange (A2, A3, and A4), natural convection occurs in the inactive refrigerant 9 (B3).

The temperature of the cooling water 8 and the internal temperature of the CPU 11 are transmitted as sensor information to the chiller 4. The heat exchanger unit 10A has a temperature sensor 52 attached thereto. The temperature sensor 52 measures the temperature of the cooling water 8 and sends temperature information of the cooling water 8 to the chiller 4 (C1). The liquid immersion cooling unit 10B has a temperature sensor 53 attached thereto. The temperature sensor 53 measures the internal temperature of the CPU 11 and sends internal temperature information of the CPU 11 to the chiller 4 (C2). An operating ratio for the chiller 4 is determined based on the temperature information of the cooling water 8 and the internal temperature information of the CPU 11. For example, if the temperature of the cooling water 8 and the internal temperature of the CPU 11 are high, the chiller 4 has a high operating ratio, and if the temperature of the cooling water 8 and the internal temperature of the CPU 11 are low, the chiller 4 has a low operating ratio.

Figure 8A:
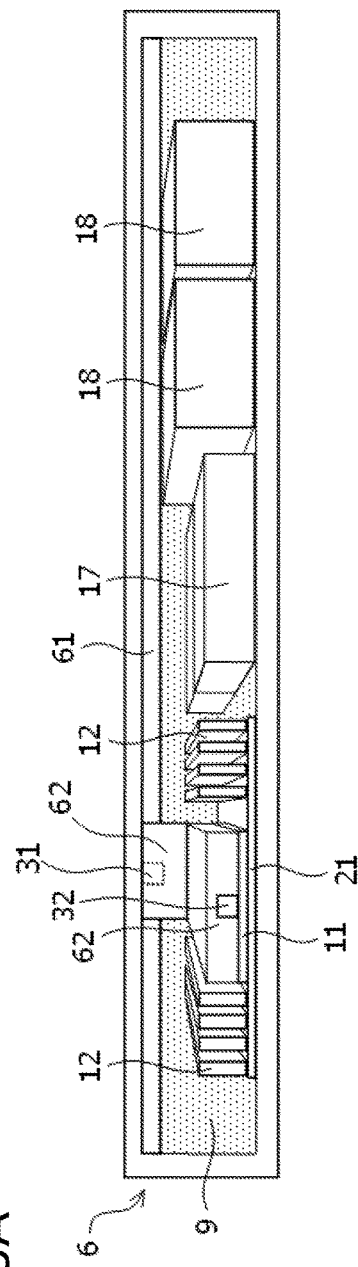
FIG. 8A is a structural view of the cooling bath according to the first embodiment.
Figure 8B:
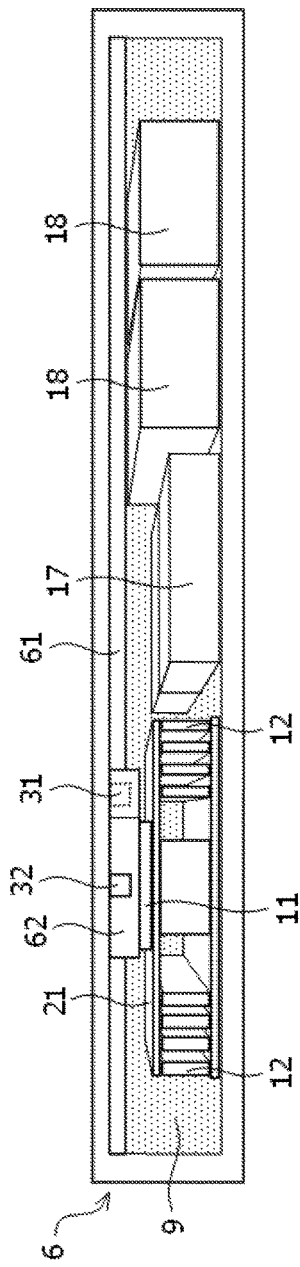
FIG. 8B is a structural view of a cooling bath according to a comparative example.

Simulation analyses were conducted regarding how the position of the cooling water supply port 32 affects the temperature of the cooling bath 6. FIGS. 8A and 8B illustrate respective structures of the cooling bath 6 used in the simulation analyses. FIG. 8A is a view illustrating the structure of the cooling bath 6 according to the first embodiment. In the cooling bath 6 depicted in FIG. 8A, the inactive refrigerant 9 is supplied to a lower portion of the cooling bath 6, and the cooling water supply port 32 is disposed in the inactive refrigerant 9. In the cooling bath 6 depicted in FIG. 8A, an air layer 61 is disposed in an upper portion of the cooling bath 6, and the refrigerant water discharge port 31 is disposed in the upper portion of the cooling bath 6. In the cooling bath 6 depicted in FIG. 8A, a flow channel that extends from the cooling water supply port 32 to the refrigerant water discharge port 31 is covered with a metal plate 62, and the cooling water 8 flows through the flow channel covered with the metal plate 62. In the cooling bath 6 depicted in FIG. 8A, the CPU 11 is held in contact with the metal plate 62.

FIG. 8B is a view illustrating the structure of the cooling bath 6 according to a comparative example. In the cooling bath 6 depicted in FIG. 8B, the inactive refrigerant 9 is supplied to a lower portion of the cooling bath 6, an air layer 61 is disposed in an upper portion of the cooling bath 6, and the cooling water discharge port 31 and the cooling water supply port 32 are disposed in the upper portion of the cooling bath 6. For example, in the cooling bath 6 depicted in FIG. 8B, the cooling water supply port 32 is not disposed in the inactive refrigerant 9. In the cooling bath 6 depicted in FIG. 8B, a flow channel that extends from the cooling water supply port 32 to the refrigerant water discharge port 31 is covered with a metal plate 62, and the cooling water 8 flows through the flow channel covered with the metal plate 62. In the cooling bath 6 depicted in FIG. 8B, the CPU 11 is held in contact with the metal plate 62.

In the cooling baths 6 illustrated in FIGS. 8A and 8B, there were two CPUs 11, and the amount of heat generated by each CPU 11 was 120 W. In the cooling baths 6 illustrated in FIGS. 8A and 8B, there were three HDDs 17, and the amount of heat generated by each HDD 17 was 30 W. FIG. 9 is a table of conditions and results of the simulation analyses conducted on the cooling baths 6 illustrated in FIGS. 8A and 8B. In the simulation analysis conducted on the cooling bath 6 illustrated in FIG. 8A, the cooling water 8 was supplied under temperature (° C.) conditions set as 15° C., 20° C., and 25° C. In the simulation analysis conducted on the cooling bath 6 illustrated in FIG. 8B, the cooling water 8 was supplied under temperature (° C.) conditions set as 15° C.

In the simulation analyses conducted on the cooling baths 6 illustrated in FIGS. 8A and 8B, 20° C. was set as an initial temperature (° C.) of the inactive refrigerant 9.

In the simulation analysis conducted on the cooling bath 6 illustrated in FIG. 8A, when the cooling water 8 was supplied at a temperature of 15° C., the temperature (° C.) of the CPU 11 ranged from 30° C. to 33° C., the highest temperature (° C.) in the cooling bath 6 was 53° C., and the cooling water 8 was discharged at a temperature of 20° C. In the simulation analysis conducted on the cooling bath 6 illustrated in FIG. 8A, when the cooling water 8 was supplied at a temperature of 20° C., the temperature (° C.) of the CPU 11 ranged from 35° C. to 38° C., the highest temperature (° C.) in the cooling bath 6 was 57° C., and the cooling water 8 was discharged at a temperature of 25° C. In the simulation analysis conducted on the cooling bath 6 illustrated in FIG. 8A, when the cooling water 8 was supplied at a temperature of 25° C., the temperature (° C.) of the CPU 11 ranged from 40° C. to 43° C., the highest temperature (° C.) in the cooling bath 6 was 62° C., and the cooling water 8 was discharged at a temperature of 30° C. In the simulation analysis conducted on the cooling bath 6 illustrated in FIG. 8B, when the cooling water 8 was supplied at a temperature of 15° C., the temperature (° C.) of the CPU 11 ranged from 30° C. to 59° C., the highest temperature (° C.) in the cooling bath 6 was 59° C., and the cooling water 8 was discharged at a temperature of 19° C.

In the cooling bath 6 illustrated in FIG. 8A, the cooling water supply port 32 is disposed in the inactive refrigerant 9, whereas in the cooling bath 6 illustrated in FIG. 8B, the cooling water supply port 32 is not disposed in the inactive refrigerant 9. As illustrated in FIG. 9, the highest temperature of the CPU 11 is lower with the cooling water supply port 32 disposed in the inactive refrigerant 9 than with the cooling water supply port 32 not disposed in the inactive refrigerant 9. The efficiency with which to cool the CPU 11 is thus increased by placing the cooling water supply port 32 in the inactive refrigerant 9 to cool the CPU 11 indirectly with the cooling water 8.

There is known a liquid immersion cooling system in which an inactive refrigerant in a cooling bath is discharged out of the cooling bath, cooled by a chiller, and supplied again to the cooling bath by a pump. In this liquid immersion cooling system, heat-generating parts such as CPUs, DIMMs, and so on are cooled by being immersed in the inactive refrigerant. If the liquid immersion cooling system has a height of approximately 360 mm, for example, the amount of the inactive refrigerant used is approximately 0.1 m³. With the liquid immersion cooling server 1 according to the first embodiment, the inactive refrigerant 9 is not discharged out of the cooling bath 6, and the cooling water 8 that is discharged into the inactive refrigerant 9 cools the CPU 11. If the liquid immersion cooling server 1 according to the first embodiment has a height of approximately 360 mm, for example, the amount of the inactive refrigerant 9 used in the cooling bath 6 is approximately 0.033 m³. Consequently, the liquid immersion cooling server 1 according to the first embodiment is effective to reduce the amount of the inactive refrigerant 9 used in the cooling bath 6.

According to the first embodiment, the cooling water supply port 32 and the flow channel 33 are disposed in the inactive refrigerant 9, and the cooling water 8 flows through the flow channel 33. The cooling water 8 that flows through the flow channel 33 absorbs heat from the heat sink 13. The heat generated by the CPU 11 is transferred to the heat sink 13. The efficiency with which to cool the CPU 11 is thus increased by cooling the CPU 11 indirectly with the cooling water 8 that flows through the flow channel 33.

According to the first embodiment, the cooling water 8 is discharged from the discharge port of the flow channel 33 into the inactive refrigerant 9, and the cooling water 8 and the inactive refrigerant 9 exchange heat therebetween in the inactive refrigerant 9. Therefore, the heat is exchanged through an increased area, accelerating the cooling of the inactive refrigerant 9. As a result, the inactive refrigerant 9 efficiently cools the DIMMs 12, the HDD 17, the PSUs 18, the IF card 19, and the circuit boards 21. With the cooling bath 6 illustrated in FIGS. 5 and 6, inasmuch as the flow channel 33 is disposed under the heat sink 13, the distance from the flow channel 33 to the heat exchanger unit 10A is longer than with the cooling bath 6 illustrated in FIGS. 2 through 4. Accordingly, with the cooling bath 6 illustrated in FIGS. 5 and 6, the cooling water 8 that has been discharged from the discharge port of the flow channel 33 into the inactive refrigerant 9 moves a longer distance to the interface between the heat exchanger unit 10A and the liquid immersion cooling unit 10B. With the cooling bath 6 illustrated in FIGS. 5 and 6, therefore, the heat is exchanged through a further increased area, further promoting the cooling of the inactive refrigerant 9.

<Second Embodiment>

Figure 10:
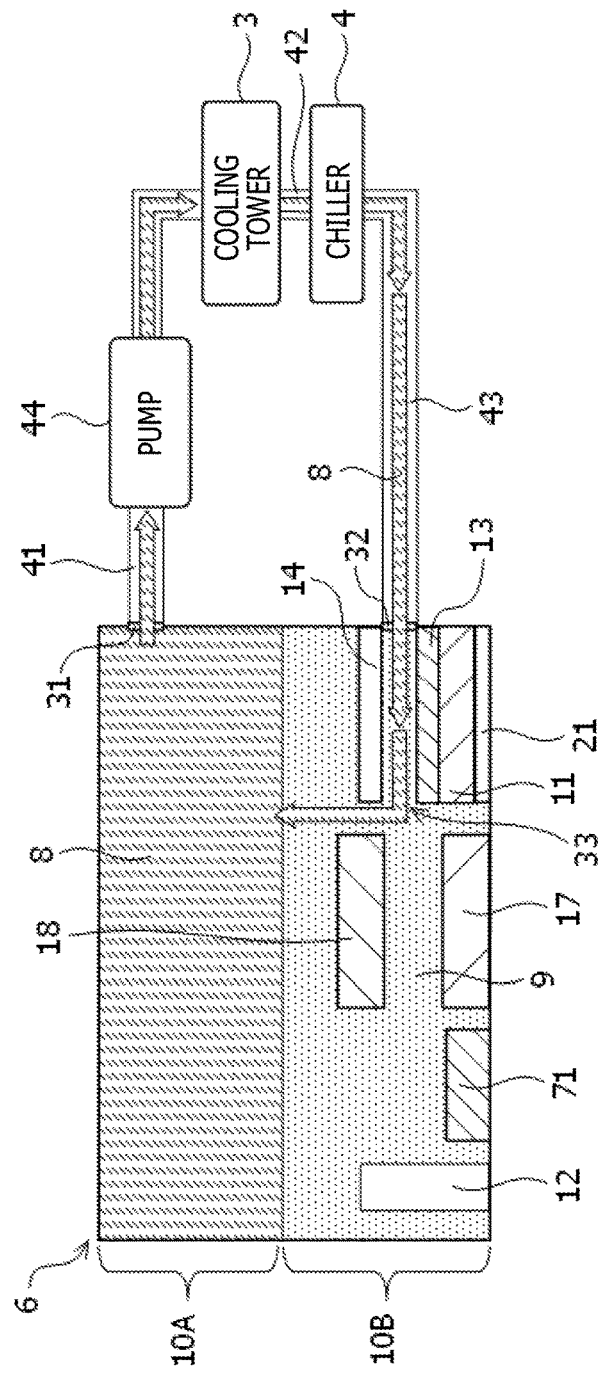
FIG. 10 is a structural view of a cooling bath as viewed from a side surface of a liquid immersion cooling apparatus according to a second embodiment.
Figure 11:
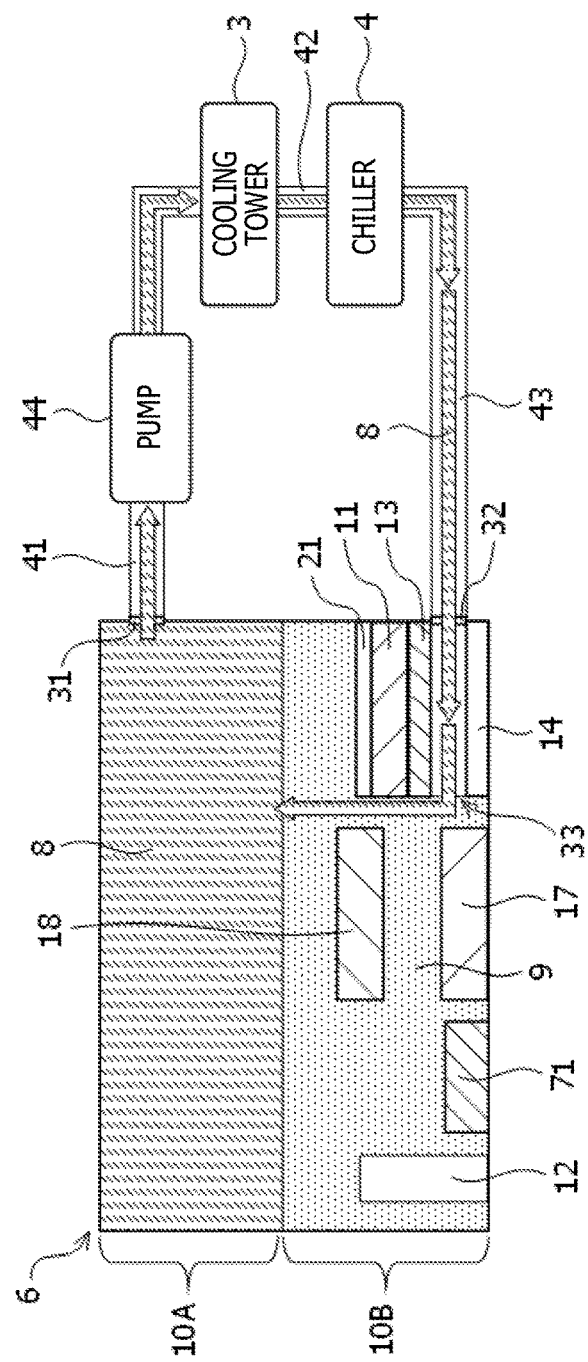
FIG. 11 is a structural view of a cooling bath as viewed from a side surface of a liquid immersion cooling apparatus according to a modification of the second embodiment.

A liquid immersion server 1 according to a second embodiment will be described below with reference to FIGS. 10 through 13. Those components of the liquid immersion server 1 according to the second embodiment which are same as those according to the first embodiment are denoted by same reference symbols, and will not be described in detail below. FIG. 10 is a structural view of a cooling bath 6 as viewed from a side surface of a liquid immersion cooling apparatus 2 according to a second embodiment, and FIG. 11 is a structural view of a cooling bath 6 as viewed from a side surface of a liquid immersion cooling apparatus 2 according to a modification of the second embodiment. Each of FIGS. 10 and 11 depicts the cooling bath 6 as viewed from the plane B1 in FIG. 1. In the structural example illustrated in FIG. 10, the flow channel 33 is disposed over the CPU 11. In the structural example illustrated in FIG. 11, the flow channel 33 is disposed under the CPU 11. In each of the structural examples illustrated in FIGS. 10 and 11, a fan 71 is disposed in the liquid immersion cooling unit 10B. When the liquid immersion server 1 is in operation, the fan 71 is immersed in the inactive refrigerant 9. When the fan 71 operates to stir the inactive refrigerant 9, forced convection occurs in the inactive refrigerant 9. When the fan 71 operates to stir the inactive refrigerant 9 while natural convention is occurring in the inactive refrigerant 9, the convection in the inactive refrigerant 9 is accelerated. A control circuit may be coupled to the fan 71 for controlling the rotational speed of the fan 71. Alternatively, the CPU 11 may control the rotational speed of the fan 71. The layout of the CPU 11, the DIMMs 12, the heat sink 13, the flow channel defining plate 14, the HDD 17, the circuit boards 21, and the fan 71 in FIGS. 10 and 11 is by way of illustrative example only.

Figure 12:
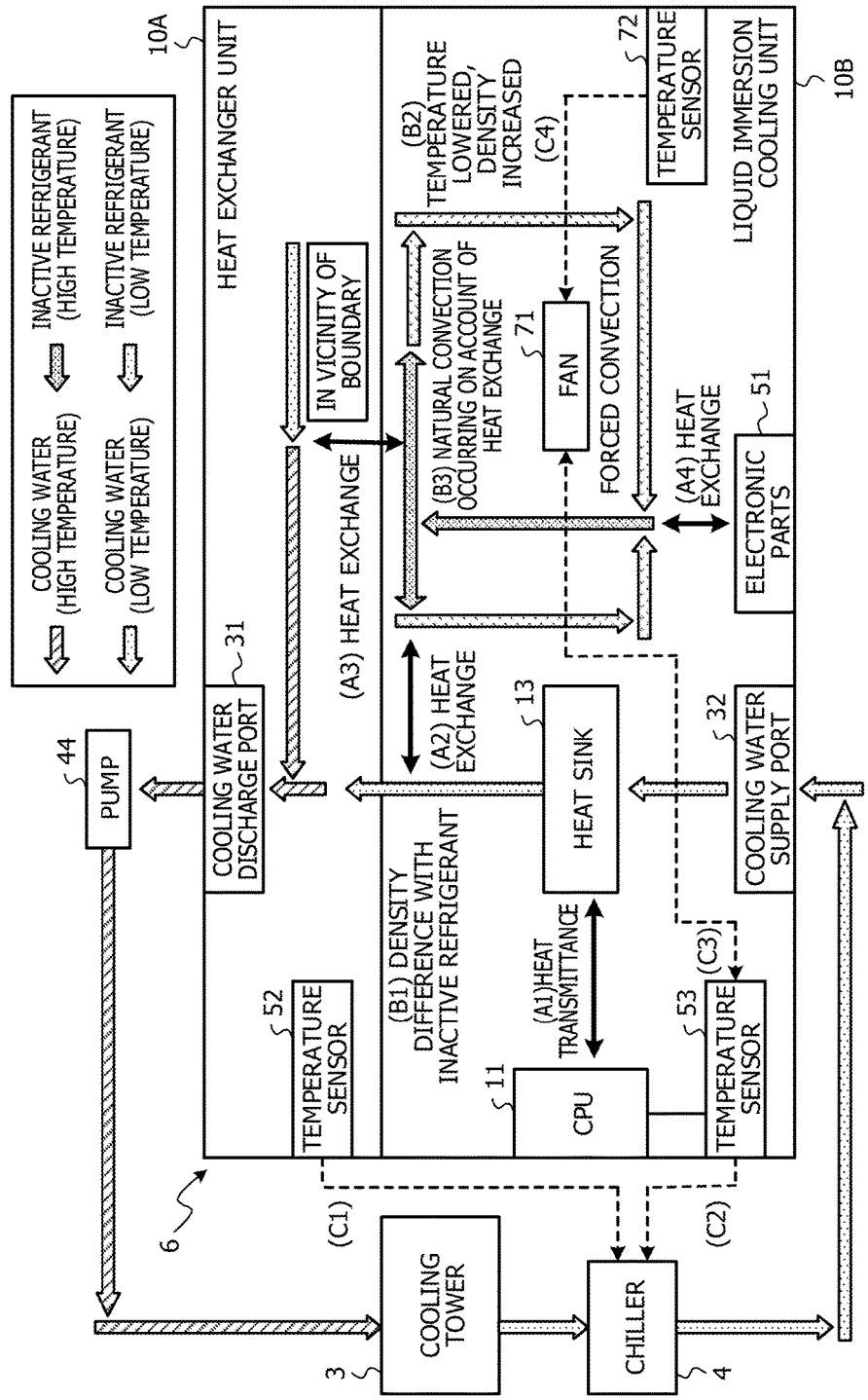
FIG. 12 is a diagram illustrating flows of cooling water and flows of an inactive refrigerant in the liquid immersion server according to the second embodiment.

FIG. 12 is a diagram illustrating flows of the cooling water 8 and flows of the inactive refrigerant 9 in the liquid immersion server 1 according to the second embodiment. Events (A1) through (A4), (B1) through (B3), and (C1) and (C2) depicted in FIG. 12 are the similar to the corresponding events (A1) through (A4), (B1) through (B3), and (C1) and (C2) depicted in FIG. 7, and will not be described in detail below.

The temperature of the inactive refrigerant 9 and the internal temperature of the CPU 11 are transmitted as sensor information to the fan 71. A temperature sensor 53 measures the internal temperature of the CPU 11 and sends internal temperature information of the CPU 11 to the fan 71 (C3). The liquid immersion cooling unit 10B has a temperature sensor 72 attached thereto. The temperature sensor 72 measures the temperature of the inactive refrigerant 9 and sends temperature information of the inactive refrigerant 9 to the fan 71 (C4). A rotational speed for the fan 71 is determined based on the internal temperature information of the CPU 11 and the temperature information of the inactive refrigerant 9. For example, if the temperature of the inactive refrigerant 9 and the internal temperature of the CPU 11 are high, the fan 71 has a high rotational speed, and if the temperature of the inactive refrigerant 9 and the internal temperature of the CPU 11 are low, the fan 71 has a low rotational speed.

In case the flow channel 33 is disposed under the CPU 11 as depicted in FIG. 11, when the fan 71 operates to stir the inactive refrigerant 9, causing forced convection to occur in the inactive refrigerant 9, the cooling water 8 that has been discharged into the inactive refrigerant 9 may possibly enter the CPU 11. If the cooling water 8 enters the CPU 11, it may cause a short circuit in the CPU 11. In view of this drawback, a protective cover 81 is disposed between the cooling water 8 discharged into the inactive refrigerant 9 and the CPU 11 to suppress the cooling water 8 from entering the CPU 11. FIG. 13 is a structural view of the cooling bath 6 as viewed from the side surface of the liquid immersion cooling apparatus 2 according to the second embodiment. FIG. 13 depicts the cooling bath 6 as viewed from the plane B1 in FIG. 1. The protective cover 81 may cover part of a side surface of the CPU 11 or may cover an entire side surface of the CPU 11. The protective cover 81 is made of a metal such as copper, aluminum, or the like, or a highly thermoconductive resin such as a resin containing an electrically conductive filler or the like. The material of the protective cover 81 may be the same as or different from the material of the flow channel defining plates 14 through 16. The layout of the CPU 11, the DIMMs 12, the heat sink 13, the flow channel defining plate 14, the HDD 17, the circuit boards 21, the fan 71, and the protective cover 81 in FIG. 13 is by way of illustrative example only.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A liquid immersion server comprising:
   a processor;
   a heat sink to which heat generated by the processor is transferred;
   a flow channel through which a first refrigerant liquid that has absorbed heat from the heat sink flows; and
   a cooling bath that stores a second refrigerant liquid that is inactive in a lower section thereof and that stores the first refrigerant liquid in an upper section thereof,
   when the liquid immersion server is in operation, the processor, the heat sink, and the flow channel are immersed in the second refrigerant liquid,
   the flow channel has a supply port to which the first refrigerant liquid is supplied and a discharge port that discharges the first refrigerant liquid that has absorbed heat into the second refrigerant liquid in the lower section of the cooling bath, and
   the density of the first refrigerant liquid is smaller than the density of the second refrigerant liquid.

2. The liquid immersion server according to claim 1, wherein the heat sink and the flow channel are disposed over the processor.

3. The liquid immersion server according to claim 1, wherein the heat sink and the flow channel are disposed under the processor.

4. The liquid immersion server according to claim 3, further comprising:
   a fan that stirs the second refrigerant liquid; and a protective cover disposed between the first refrigerant liquid discharged from the discharge port of the flow channel into the second refrigerant liquid and the processor.

5. The liquid immersion server according to claim 1, further comprising:
a cooling apparatus that cools the first refrigerant liquid discharged into the discharge port; and
a pump that delivers the first refrigerant liquid discharged into the discharge port to the cooling bath.

* * * * *